United States Patent [19]

Cade

[11] 4,157,560

[45] Jun. 5, 1979

[54] PHOTO DETECTOR CELL

[75] Inventor: Paul E. Cade, Colchester, Vt.

[73] Assignee: International Business Machines Corporation, Armonk, N.Y.

[21] Appl. No.: 866,128

[22] Filed: Dec. 30, 1977

[51] Int. Cl.² ............................................. H01L 27/14
[52] U.S. Cl. ........................................ 357/30; 357/48; 357/89; 357/88
[58] Field of Search ........................ 357/30, 48, 89, 88

[56] References Cited

U.S. PATENT DOCUMENTS

| 3,529,217 | 9/1970 | Van Santen | 317/235 |
| 3,812,518 | 5/1974 | Kurz | 357/30 |
| 3,836,793 | 9/1974 | Haitz | 307/303 |
| 3,968,511 | 7/1976 | Yogi | 357/36 |
| 3,994,012 | 11/1976 | Warner, Jr. | 357/30 |

*Primary Examiner*—Martin H. Edlow
*Attorney, Agent, or Firm*—Francis J. Thornton

[57] ABSTRACT

A smaller, faster, more efficient photo detector cell can be created with improved photo sensitivity in the short wavelength regions, using well known integrated circuit production techniques, by forming the photo sensitive junction of the device in an isolated region of a thin epitaxial layer overlying a thin subcollector so as to use all the current generated in the cell. The cell thus comprises a semiconductor body having an epitaxial layer thereon which is divided into isolated pockets containing a photosensitive junction overlying a subcollector region formed at a depth of less than 10 microns between the substrate and the epitaxial layer. The photo sensitive junction of the device merges with the isolation region so that a single continuous P-N junction surrounds substantially all subcollectors and the isolated pocket of epitaxial material. A device constructed as taught realizes approximately 100% quantum efficiency over a wide range of incident light.

5 Claims, 6 Drawing Figures

PHOTO DETECTOR CELL

BACKGROUND OF THE INVENTION

1. Field of the Invention

This invention relates to photo detector cells and more particularly to a photo detector cell in which the photo sensitive portion of the device is contained within a region of one conductivity type substantially enclosed by a second conductivity type material.

2. Description of the Prior Art

Photo detector cells formed in semiconductor bodies are well known to the prior art. U.S. Pat. Nos. 3,529,217, 3,812,581, and 3,836,793 all teach that the socalled parasitic currents in the backbiased isolation junction should be reduced by creating a shielded very, very thick epitaxial layer overlying a very thick subcollector region, buried so deep that minority carriers are generated so far above it that this subcollector acts as a reflector of minority carriers. U.S. Pat. No. 3,529,217 further teaches the epitaxial layer should be coated with an opaque material extending at least one minority diffusion length from the isolation sidewalls to prevent diffusion of minority carriers to these walls.

Thus all of these prior art patents teach that by extending the buried subcollector layer more deeply into the substrate radiation will not penetrate to the subcollector substrate junction and minority charge carriers produced at the radiation sensitive P-N junction will not diffuse down to the subcollector substrate junction and that photons absorbed within the lower half of the buried collection region will not contribute to the photo current.

SUMMARY OF THE INVENTION

It is an object of the present invention to provide a more efficient photo sensitive device in which substantially total photo absorption efficiency is realized by using a very thin epitaxial layer, containing a shallow photo sensitive P-N junction and overlying a thin subcollector.

The use of a thin epitaxial region merged with the substrate to encompass with a single P-N junction a buried epitaxial region and an underlying thin subcollector results in a superior, more efficient photo sensitive device with a significantly faster response time than any found in the prior art.

Still further the present invention teaches that shielding is necessary only to prevent cross coupling between cells when more than one cell is produced on the same semiconductor substrate. The geometrical efficiency of the cell is thus signficantly improved.

It is still a further object of the invention to produce a more efficient photo detector cell with significantly higher speeds by producing the device in a unique vertical structure in which all generated carriers contribute to the current.

The photo detector cell of the invention, thus comprises a semiconductor body having a thin, P-N junction isolated, epitaxial region thereon in which there is defined a photo sensitive junction which merges with the P-N junction isolating the epitaxial region from the body.

These and other objects, features and advantages of the invention will be apparent from the following or particular description of the preferred embodiment of the invention as illustrated in the accompanying drawings.

DESCRIPTION OF THE PREFERRED EMBODIMENT

Figure 1:
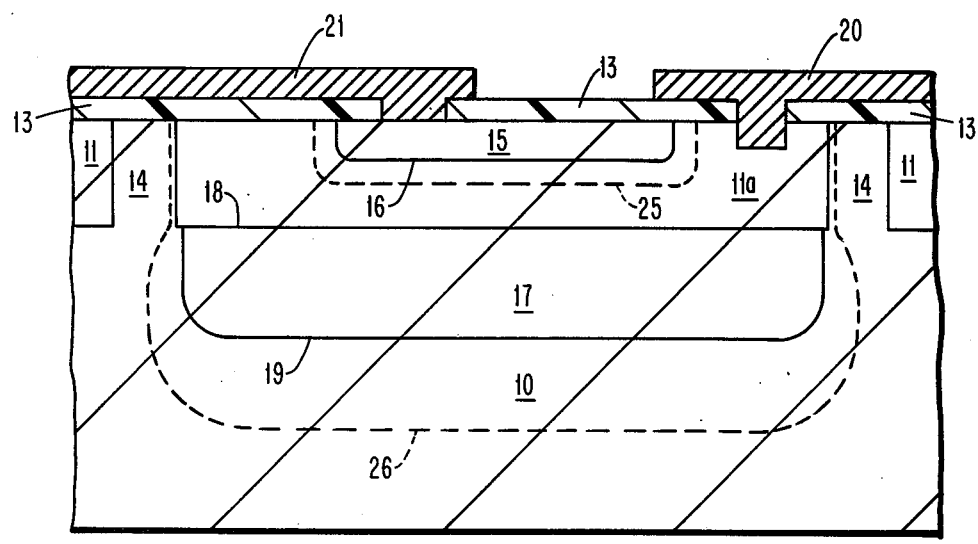
FIG. 1 is a sectional view of a prior art photo detector cell.

FIG. 1 is a cross-sectional view of a typical prior art semiconductor photo sensitive device. This device is comprised of a substrate 10 of P— type material having a resistivity of about 3 Ohm-cm on which an epitaxial layer 11 of N— type silicon is provided. This epitaxial layer 11 has a distinct island 11a separated from the main layer 11 by a ring like P— type isolation channel 14 which extends from the surface of the device through the epitaxial layer to merge with the substrate 10. A diffused P— type conductive zone 15, 3 microns deep, is provided adjacent the surface and is surrounded by the island of epitaxial material 11a with which it forms a P-N junction 16. Below the zone 15 lies a buried N+ type subcollector layer 17 having an interface 18 with the epitaxial layer 11. A second distinct P-N junction 19 is formed between the subcollector 17 and the substrate 10. This junction 19 joins with the junction between the P+ isolation channel 14 and the epitaxial layer 11a. Thus the prior art describes a device having two separate, distinct, discontinuous P-N junctions 16 and 19.

The radiation of visable light lies generally in the range of 4000 Å to 8000 Å. The absorption length of the radiation having the maximum penetration and the greatest wavelength (8000 Å) is about ten microns.

Because the prior art wanted to assure that no charge carriers were generated below the upwardly directed drift fields existing near the interface 18, the interface 18 was set at 10 microns below the surface of the device. The vertical distance of the P-N junction 16 was set to have a distance of 7 microns between it and the interface 18. Also, to assure that none of the minority carriers produced in the body would penetrate to the P-N junction 19, the subcollector 17 was made to extend into the substrate 10 microns which is in excess of two diffusion lengths of the minority carriers (in this case holes) produced by absorption of light in the subcollector.

An oxide layer 13 is provided over the surface of the device and via holes provided therein to make contact with the island 11a and the diffusion 15.

A conductive layer 20 is provided over the oxide 13 to make contact with the N— type epitaxial island 11a and a further conductive layer 21 makes contact with the diffused region 15. In order to avoid undesirable photo currents due to light incident on the boundaries of the P-N junctions 16 and 19 terminating at the surface, the conductive layers 20 and 21 are made opaque and formed so that they overlap substantially the P-N junctions 16 and 19 everywhere they intersect the surface.

When the device is biased, say for example, with eight volts between terminals 20 and 21, a depletion region is created around the junction 15 which, as indicated by dotted line 25, extends a distance of about 1 micron into the N— type material 11a. Of course the depletion region extends on both sides of the biased junction 16 but because of applied voltage and the doping concentration of the region 15 it extends such a short distance into the region 15 that for the sake of clarity its boundary in region 15 is not shown. A similar depletion region extends around the P-N junction 19 when the substrate is biased with respect to epitaxial island 11a and the subcollector 17. Again for the sake of clarity only the further extending boundry 26 of this depletion region is shown. Because the substrate is light doped this boundry 26 lies deep in the substrate 10.

Figure 2:
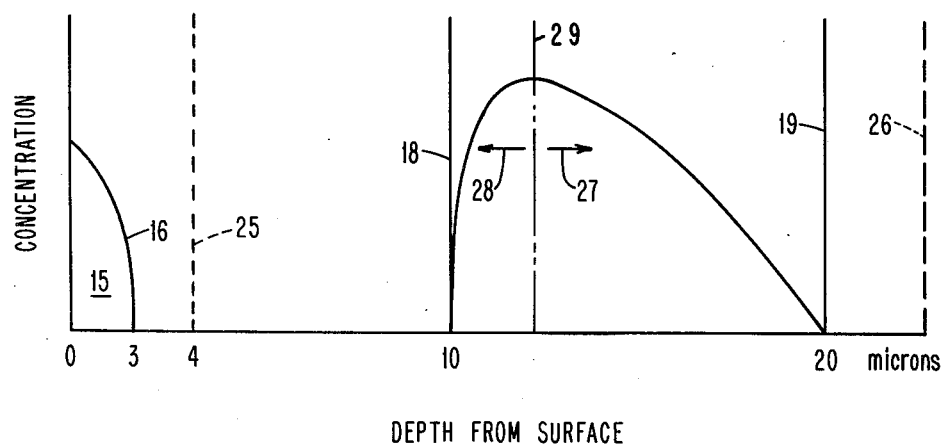
FIG. 2 is a chart showing the relative junction depth, depletion depths and field conditions of the prior art device shown in FIG. 1.

These relationships are better portrayed in FIG. 2 which relates the doping concentraton in various portions and other characteristics of the device with respect to their depth in the device.

Of particular note in this FIG. 2 is the drift fields existing in the subcollector 17. These drifts fields occur because of the concentration of the subcollector with respect to the adjacent epitaxial area 11a and the substrate 10. These drift fields extend in both directions, as indicated by arrows 28 and 27, from the point of greatest concentration in the subcollector region 17 indicated by line 29. The prior art, by setting the subcollector deep in the substrate used the uppermost drift field 28 to force minority charge carriers formed between the P-N junction 16 and the interface 18 towards the P-N junction 16 thus reducing current across junction 19 which current was, in the prior art, lost and considered parasitic leakage current. Any minority carrier generated below the point of highest concentration in the subcollector 17 will be forced in the direction of arrow 27 by the lower drift field across junction 19. These carriers then become absorbed in the substrate and do not contribute to the current generated by the device.

By extending the subcollector deep into the substrate, the prior art caused the P-N junction 19 to be created so deeply in the body that little or no radiation would penetrate to it and few minority carrier would diffuse down to it.

The intensity of a monochromatic beam of light will be reduced as it travels through an absorbing media according to the classical Beer's law relationship which depends upon the initial flux at the surface of the body, the distance into the body the light flux penetrates the body and the absorption coefficient of the body through which the light flux passes. In a silicon photo sensitive diode, for example, when the photon energy, i.e., the wavelength of the absorbed light, is greater than the band gap of silicon, each absorbed photon will generate a hole-electron pair and in each depletion region surrounding the P-N junction in such semiconductor diodes, each hole-electron pair gives rise to a single charge carrier while in the remaining regions only the minority carrier from the hole-electron pair contributes to the external current. The ratio of the number of hole-electron pairs produced to the number of minority carriers crossing the current collecting P-N junction defines the quantum efficiency of the device. The responsitivity of the device, which is the ratio of current density output to the incident flux input, is linearly dependent upon the wavelength of the incident light and exponentially dependent on the subcollector depth. Therefore, the subcollector depth represents a fundamental limitation on the maximum available photon generated current in such photo sensitive devices. Thus, there are in essence three regions of the semiconductor body which must be examined: 1. The P— type surface diffused region, 2. The intermediate region lying between the depletion region and the interface of the subcollector with the epitaxial layer and 3. The subcollector itself. Each of these must be considered. The P— type surface layer 15 and it associated space charge region or depletion region is the simplist to handle, in that all hole-electron pairs generated therein are immediately swept apart and forced by the fields in this region, across the P-N junction 16, contributing to the current. However hole-electron pairs generated below the lower boundry 25 of the depletion region but above the interface 18 migrate by a diffusion mechanism towards the junction 16 which is slow.

Because the minority carrier (holes) have a diffusion length in the described material of about 4 microns and this intermediate region between depletion region boundry 21 and interface 18 is about 6 microns significant recombination occurs for the minority carrier move through this region only by diffusion. Because of this recombination the quantum efficiency of the device is reduced. Those carriers that are generated close to or slightly below the interface 18 are influenced by the drift field, indicated by arrow 26 and forced towards the junction 16. Because of the influence of this drift field 28 the minority carriers can not diffuse towards junction 19. Thus the upper region of the subcollector acts as a reflector for minority charges created above it.

Those carriers produced in the subcollector 17 below the point of highest concentration 29 fall under the influence of drift field 27 and are swept to junction 19. Because the carriers crossing junction 19 are not collected they do not contribute to the current and are lost in the substrate 10.

For these reasons the quantum efficiency of the described prior art device becomes significantly reduced as the wavelength of the incident light increases. At 5000 Å the quantum efficiency of such a prior art device is only 80%, to 6300 Å it falls to 62%, at 8000 Å it is further reduced to 29%, and at 9000 Å it falls to a mere 14%.

Thus the prior art taught that it was necessary that the epitaxial layer-subcollector interface should be about 10 microns from the surface and the subcollector-substrate junction 19 should be 20 microns from the surface to prevent charge from being generated near the subcollector-substrate P-N junction 19 and to prevent minority carriers from disappearing in the substrate across P-N junction 19 and thus not being collected by the photo responsive P-N juntion 16. Any current flow across junction 19 was considered by the prior art to be leakage current and lost.

The present invention now teaches that none of this current needs to be lost and all generated charges can be made to contribute to the detected circuit. Thus the quantum efficiency of the device of the present invention is substantially increased and approaches 100 %.

Figure 3:
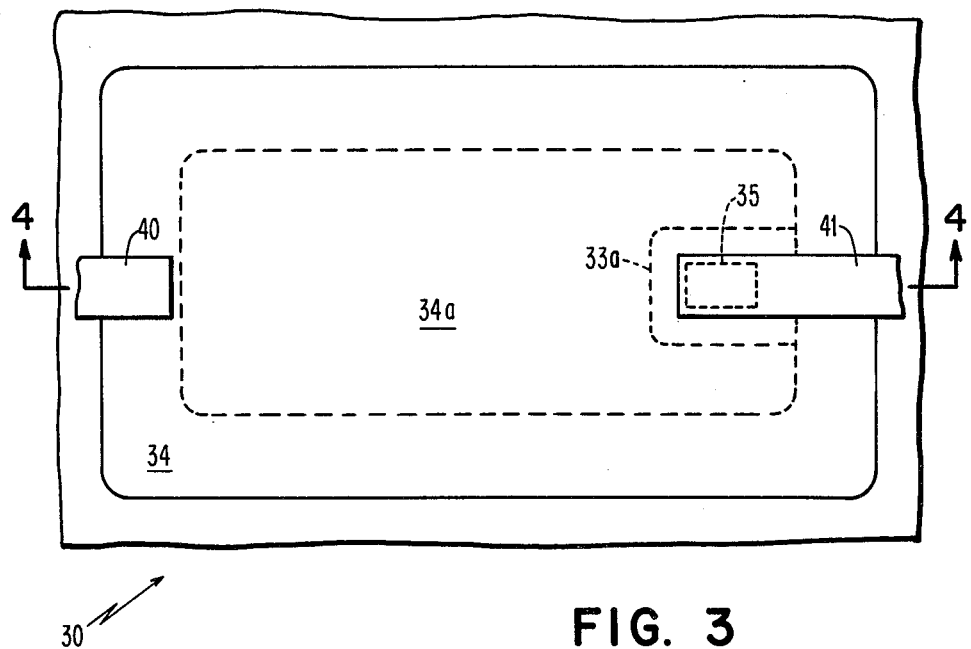
FIG. 3 is a plan view of the surface of the photo detector element of the present invention.
Figure 4:
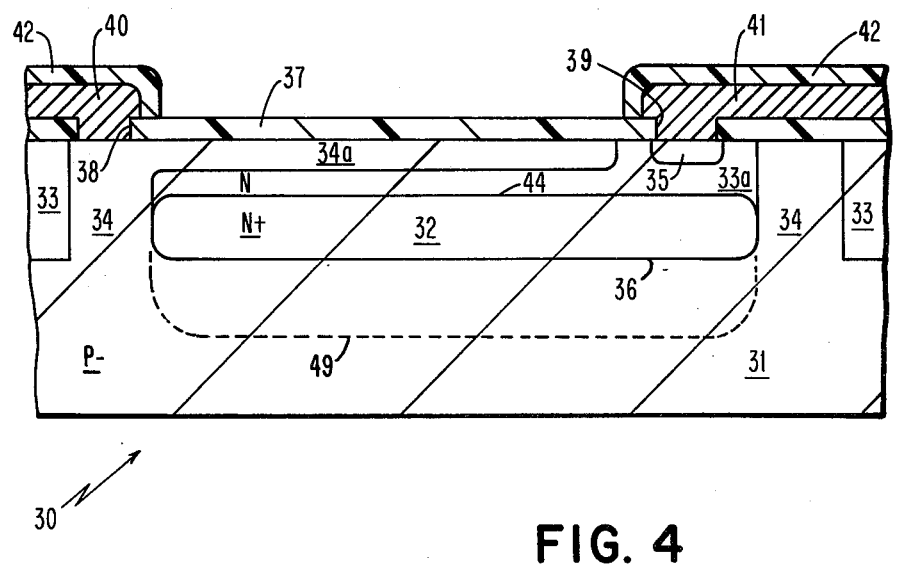
FIG. 4 is a cross sectional view of a fully completed cell taken along the lines 4—4 of FIG. 1.
Figure 5:
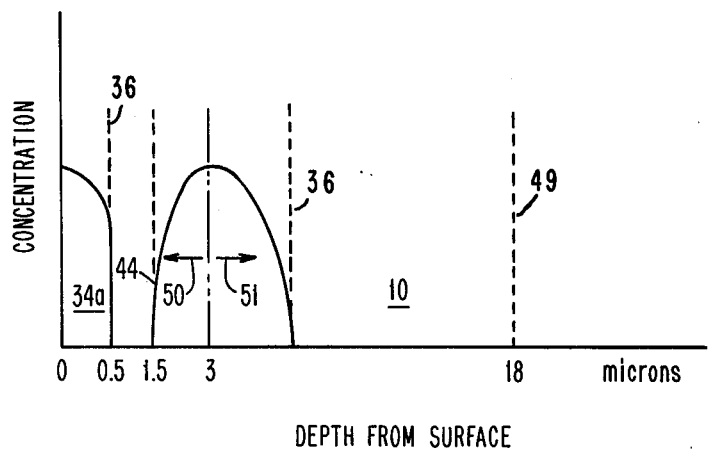
FIG. 5 is a chart showing the relative junction depths, depletion depths, and field conditions of the device of the invention shown in FIG. 4.

The device of the present invention that accomplishes this is shown especially in FIG. 3 and FIG. 4. In these figures there is shown an improved photo detector cell 30 created in accordance with the present invention and which achieves almost 100% quantum efficiency over the entire range of visable light in 4000 Å to 9000 Å.

The device comprises a silicon semiconductor body 31 of P− type silicon of a resistivity of about 5 Ohm-cm into which, by conventional integrated circuit techniques, an N− type subcollector region 32 is diffused. The process of diffusion is continued until the subcollector region reaches a depth of but 3 microns in the body. An N− type epitaxial layer 33, of about 0.5 Ohm-cm resistivity is then grown on the substrate, at a temperature of about 1200° C. by known techniques, to a thickness of not more than 4 microns. As the epitaxial layer 33 grows on the surface of the substrate 31 the subcollector region 32 will partially penetrate, i.e., about 1.4 microns into the growing epitaxial layer 33. Once the epitaxial layer 33 has been grown to the desired thickness, the unit is treated, using known techniques such as ion implantation, diffusion, etc., to create a P+ isolation ring 34 which penetrates the entire thickness of the epitaxial layer 33 to merge with the P− type substrate 31 so as to completely surround and isolate the subcollector region 32 and to isolate and define a central pocket 33a of the epitaxial layer 33. This central pocket 33a overlies the subcollector region 32. Following creation of this P+ isolation ring 34 a shallow P+ surface layer 34a about 0.5 microns deep is formed by diffusion or other techniques to cover substantially the entire surface of the defined central pocket 33a of the layer 33 overlying the subcollector region 32 and to merge with the P+ isolation ring 34. It should now be noted the pocket of N− type material 33a and the subcollector 32 are almost completely surrounded by a single, continuous P-N junction 36. The shallow P+ surface layer 34a is provided with a small opening through which an N+ region 35 is diffused to provide a contact to the N pocket 33a. Subsequently the device is provided with a layer of silicon dioxide 37 approximately 8000 angstroms thick. Through this layer 37 there is provided two separate windows or via holes 38 and 39. The window 38 overlying a portion of the ring isolation ring 34 and the window 39 overlying the N− type diffusion 35. Once these windows are opened conductive aluminum lines 40 and 41 are provided so as to make contact with the underlying isolation ring 34 and the diffusion 35. If desired, a quartz coating 42 can be disposed over the metal lines 38 and 39. Preferably the conductive line 40 should be formed to overly the entire isolation ring 34 to prevent light from entering the isolation ring and causing cross-talk in adjacent devices.

This device is biased by applying, for example, 8 volts between conductors 40 and 41 which biases the junction 36. Because the distance between the bottom of diffusion 34a and the interface 44, between the subcollector 32 and the pocket 33a, is between 0.5 microns and one micron and at this described biasing voltage the entire region 33a between region 34a and the subcollector 32 becomes totally depleted. Thus in these figures the lower edge of this depletion region is not shown for it lies substantially along the line of the interface 44. Of course, this biasing of P-N junction 36 causes a depletion region to extend into the substrate a considerable distance. For the described bias this depletion region will extend about 10 microns into the body 31 so that the lower edge of this depletion in the body is about 18 microns from the surface of the body as indicated by dotted line 49. Because of the concentration of ring 34 and region 34a, the depletion region does not extend very far in them.

It should be noted as contrasted with the prior art devices shown in FIG. 1 and 2, that, in the present invention, the subcollector substrate interface 36 lines with 10 microns of the surface; the epitaxial layer 33 is thin, i.e., less than 4 microns in thickness; the diffused region 34a is not only shallow, i.e., less than 1 micron in thickness, but forms a P-N junction with the epitaxial material and that this P-N junction joins, through the isolation ring 34, with the P-N junction formed between the diffused region 34a, and the epitaxial material 33a to form a single continuous P-N junction 36 substantially surrounding the entire buried N− type epitaxial region 33a and subcollector 32.

Once again, as described above, when electromagnetic radiation in the range of 4000 Å to 9000 Å strikes the defined region within the confines of isolation ring 34 it becomes absorbed in the semiconductor and hole-electron pairs are generated. If these pairs are generated in the region 34a or in the totally depleted region 33a the minority carriers are immediately swept across the P-N junction lying between region 34a and region 33a. Those pairs generated in the upper portion of the subcollector 32 fall under the influence of the drift field indicated by arrow 50 and the minority carrier of the pair is driven upwards towards that portion of the P-N junction 36 lying between diffusion 34a and epitaxial region 33a.

Those pairs generated in the lower half of the subcollector fall under the influence of the drift field indicated by arrow 51 and the minority carriers are swept towards that portion of the junction 36 lying between the subcollector 32 and the substrate 31. Those pairs created in the depletion region below the subcollector are also swept towards this portion of the junction 36.

Because the portion of the junction 36 lying between the subcollector region 32 and the substrate 31 lies at but 8 microns and because the lower depletion region extends in the substrate to 18 microns below the surface of the device and because all the light in the range of interest, i.e., 4000 Å to 9000 Å, will be absorbed within 15 microns, all generated minority carriers created in the device of the present invention immediately fall under the influence of either a drift field or a depletion region and thus are swiftly forced across the collecting junction 36 thus the response time of the device is very fast. Also, since there are no regions across which the minority carriers migrate by a diffusion mechanism, practically no recombination can occur, and substantially 100% quantum efficiency is realized.

Moreover, because the device is made with but a single P-N junction 36, all minority carriers generated will be swept across this single junction 36 and collected.

Figure 6:
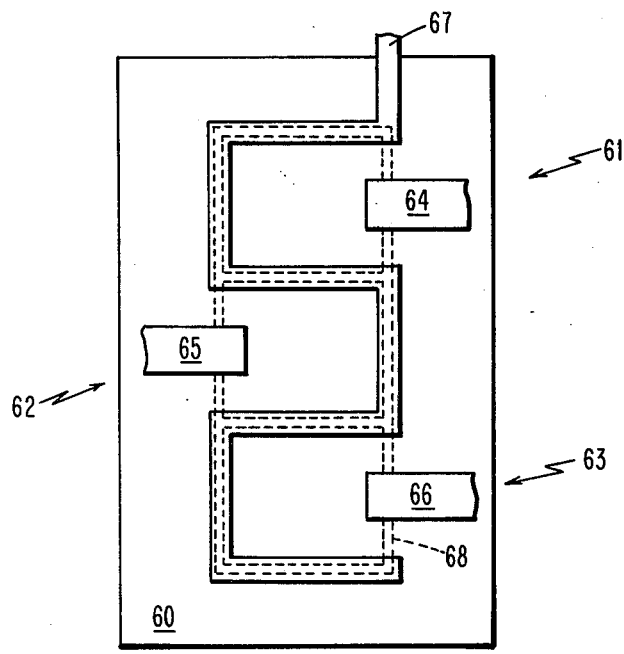
FIG. 6 shows a plurality of the cells of the present invention arranged as a linear scanner.

FIG. 6 shows three devices 61, 62, and 63 built in accordance with the present invention in a single substrate 60. As shown three separate heads 64, 65, and 66 are made to respective buried epitaxial regions while a single conductive, serpentine line 67 overlies substantially all of the isolation channels between the devices. This isolation channel is a continuous ladder like configuration 68 shown in phanthom. For the sake of clarity only the isolation channel is shown separating each device from the adjacent devices but it should be understood that each device is identical to the device as shown in FIGS. 3 and 4. The line 67 not only serves to make electrical contact to the isolation channels but also to cover the channel between devices to present crosstalk between adjacent devices.

While the invention has particularly shown and described with preference to preferred embodiments thereof, it will be understood by those skilled in the art that various changes in form and details may be made therein without departing from the spirit and scope of the invention.

What is claimed is:

1. A photo detector cell comprising
   a body of semiconductor material of a first conductivity type having a surface,
   a buried layer of semiconductor material of a second conductivity type disposed within said body beneath said surface wherein said buried layer has an upper region of a specified resistivity and a lower region having a resistivity different from that of said upper region
   a single, continuous rectifying junction, formed between said layer and said body, disposed around all sides of and enclosing said layer of second conductivity type;
   said junction being less than 10 microns from said surface, and
   means for biasing said body and said layer of second conductivity type to form a depletion region around said junction that extends across the entire thickness of said layer of said upper region.

2. The cell of claim 1 wherein said layer of said second conductivity type is less than 4 microns in thickness.

3. The cell of claim 1 wherein said junction is spaced from the surface of the device to collect substantially all the carrier generated in said cell by light in the range of 4000 Å to 9000 Å incident on the surface of said cell.

4. A photo detector cell comprising
   a body of semiconductor material of first conductivity type,
   a plurality of regions of semiconductor material of opposite conductivity type disposed in said body, each region forming a respective p-n junction with said body,
   a channel of semiconductor material of said first conductivity type disposed on and merging with said body between and around each of said regions to surround and isolate each of said regions from one another and forming a p-n junction with each of said regions that merges with the respective p-n junction formed between a respective region and said body,
   an overlayer of semiconductor material of said first conductivity type extending over each of said isolated regions and merging into said channel and forming a p-n junction with each of said regions, said p-n junction merging with the p-n junction formed between each respective region and said channel to enclose each respective region with a single continuous p-n junction,
   opaque material deposited over said channel, and
   a respective conductive contact to each of said regions and a single conductive contact to said body for extracting electrical signals from each of regions when radiation is incident thereon.

5. A Photo detector cell comprising
   a body of single crystalline semiconductor material,
   first, second and third regions of a first conductivity type in said body,
   said first and second regions having substantially parallel surfaces with said second region being disposed beneath said first region,
   said first region having a surface suitable for exposure to light in the range of 4000 angstroms to 8000 angstroms, and
   a fourth region of a second conductivity type, in said body between said first and second regions, having top and bottom surfaces substantially parallel to said surface of said first region and side surfaces substantially perpendicular to said surface of said first region said fourth region has an upper region of a specified resistivity and a lower region have a resistivity different from that of said upper region,
   said top surfce of said fourth region forming a top p-n junction surface said first region, said bottom surface of said fourth region forming a bottom p-n junction with said second region and said side surfaces of said fourth region forming a side p-n junction with said third region and merging with said top and bottom p-n junctions to form a continuous rectifying junction disposed around and substantially enclosing said fourth region,
   said bottom p-n junction lying less than 10 microns below said surface of said first region, and
   means for electrically contacting said body and said fourth region.

* * * * *